United States Patent
Hébert

(10) Patent No.: US 8,222,694 B2
(45) Date of Patent: *Jul. 17, 2012

(54) TRUE CSP POWER MOSFET BASED ON BOTTOM-SOURCE LDMOS

(75) Inventor: François Hébert, San Mateo, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/965,778

(22) Filed: Dec. 10, 2010

(65) Prior Publication Data

US 2011/0073943 A1    Mar. 31, 2011

Related U.S. Application Data

(63) Continuation of application No. 12/345,467, filed on Dec. 29, 2008, now Pat. No. 7,851,856.

(51) Int. Cl.
*H01L 29/76* (2006.01)
*H01L 29/94* (2006.01)

(52) U.S. Cl. ........ 257/337; 257/336; 257/341; 257/343; 257/E29.118; 257/E29.198; 438/268; 438/273

(58) Field of Classification Search .............. 257/334, 257/336, 337, 341, 343, E29.118, E29.198; 438/268, 273
See application file for complete search history.

(56) References Cited

U.S. PATENT DOCUMENTS

| | | | |
|---|---|---|---|
| 6,133,634 A | 10/2000 | Joshi | |
| 6,469,384 B2 | 10/2002 | Joshi | |
| 6,646,329 B2 | 11/2003 | Estacio et al. | |
| 6,653,740 B2 | 11/2003 | Kinzer et al. | |
| 6,767,820 B2 | 7/2004 | Standing et al. | |
| 6,958,515 B2 | 10/2005 | Hower et al. | |
| 7,535,058 B2 | 5/2009 | Liu et al. | |
| 7,851,856 B2 * | 12/2010 | Hebert | 257/337 |
| 2001/0032990 A1 | 10/2001 | Koyama et al. | |
| 2001/0048116 A1 | 12/2001 | Standing et al. | |
| 2003/0052405 A1 | 3/2003 | Moriguchi | |
| 2005/0285189 A1 | 12/2005 | Shibib et al. | |
| 2008/0023785 A1 | 1/2008 | Hebert | |

(Continued)

OTHER PUBLICATIONS

Notice of Allowance and Fees Due dated Aug. 4, 2010 issued for U.S. Appl. No. 12/345,467.

*Primary Examiner* — Ngan Ngo
(74) *Attorney, Agent, or Firm* — Joshua D. Isenberg; JDI Patent

(57) ABSTRACT

A semiconductor package may comprise a semiconductor substrate, a MOSFET device having a plurality cells formed on the substrate, and a source region common to all cells disposed on a bottom of the substrate. Each cell comprises a drain region on a top of the semiconductor device, a gate to control a flow of electrical current between the source and drain regions, a source contact proximate the gate; and an electrical connection between the source contact and source region. At least one drain connection is electrically coupled to the drain region. Source, drain and gate pads are electrically connected to the source region, drain region and gates of the devices. The drain, source and gate pads are formed on one surface of the semiconductor package. The cells are distributed across the substrate, whereby the electrical connections between the source contact of each device and the source region are distributed across the substrate.

24 Claims, 12 Drawing Sheets

U.S. PATENT DOCUMENTS

| | | |
|---|---|---|
| 2008/0035987 A1 | 2/2008 | Hebert |
| 2008/0173924 A1* | 7/2008 | Tabe et al. .................... 257/315 |
| 2009/0267145 A1 | 10/2009 | Pearce et al. |
| 2010/0155839 A1 | 6/2010 | Grebs et al. |
| 2010/0163979 A1 | 7/2010 | Hebert |

* cited by examiner

TRUE CSP POWER MOSFET BASED ON BOTTOM-SOURCE LDMOS

CLAIM OF PRIORITY

This application is a continuation of and claims the priority benefit of commonly-assigned, co-pending U.S. patent application Ser. No. 12/345,467 entitled "TRUE CSP POWER MOSFET BASED ON BOTTOM-SOURCE MOSFET" to François Hébert, filed Dec. 29, 2008, the entire disclosures of which are incorporated herein by reference.

FIELD OF THE INVENTION

The invention relates generally to semiconductor power devices, and more particularly to a bottom-source metal oxide semiconductor field effect transistor (MOSFET) structure and a low cost process of chip scale package (CSP).

BACKGROUND OF THE INVENTION

Conventional technologies to further reduce the source inductance and resistance for semiconductor power devices including the source inductance in FET, MOSFET and JFET devices are challenged by several technical difficulties and limitations. There are ever increasing demands to reduce the source inductance and resistance in semiconductor power devices because more and more power devices are required to being used in applications that demand high efficiency, high gain, and high frequency semiconductor power devices. Reductions in source inductance can be achieved by eliminating the bond-wires in the package of a semiconductor power device. Many attempts have been made to eliminate bond-wires by configuring the semiconductor substrate as a source connection for the semiconductor power devices. There are difficulties in such approaches due to the fact that typical vertical semiconductor power devices are arranged to place the drain electrode on the substrate. The top source electrode usually requires bond wires for electrical connections during a device packaging process thus increasing the source inductance.

While silicon process technology has advanced significantly in the past decade, for the most part, the same decades-old packaging technology continues to be used as the primary packaging means. Epoxy or solder die attachment along with aluminum or gold wire bonding to a lead frame is still the dominant semiconductor packaging methodology. Advances in semiconductor processing technology, however, have made parasitics (e.g., resistances, capacitances and inductances) associated with conventional packaging techniques more of a performance-limiting factor. In the case of conventional flip chip technology, among other shortcomings, electrical connection to the back side of the die (for vertical semiconductors) is not easily facilitated. These limitations become quite significant in high current applications such as power switching devices.

U.S. Pat. No. 6,767,820 and US publication number 20010048116 disclose a chip scale package of a semiconductor MOS-gated device. A source side of a MOS-gated device wafer is covered with a passivation layer, preferably a photosensitive liquid epoxy, or a silicon nitride layer, or the like. The material is then dried and the coated wafer is exposed using standard photolithographic techniques to image the wafer and openings are formed in the passivation layer to produce a plurality of spaced exposed surface areas of the underlying source metal and a similar opening to expose the underlying gate electrode of each die on the wafer. The openings in the passivation layer are typically made through to a conventional underlying solderable top metal such as titanium, tungsten, nickel, or silver. After the openings are formed, the wafer is then sawn or otherwise singulated into individual die. The solderable drain side of the die is then connected to a U-shaped or cup-shaped drain clip, using a conductive epoxy, solder, or the like to bond the bottom drain electrode of the die to the drain clip. The bottoms of the legs of the drain clip are coplanar with the source-side surface (that is the tops of the contact projections) of the die. The U-shaped clip is usually made of a copper alloy with at least partially plated silver surfaces and is actually very thin. However, connecting dies to individual clips tends to be time consuming compared with wafer level processing. In addition, different U-shaped clips are typically needed for different die sizes, and the clips take extra space on the PC board.

US publication number 2003/0052405 discloses a vertical power MOSFET device with the drain electrode formed on the bottom surface of the silicon substrate connected to the lead frame above it whereas the gate electrode and the source electrode exposed to the bottom of the device. The MOSFET device is sealed by a resin, such as epoxy or silicone, such that the MOSFET device and an inner part of the lead frame are covered. On the bottom surface of the MOSFET device, the surface of the resin is approximately flush with surfaces of the lead frame and gate/source electrodes. That is, on the bottom surface of the semiconductor device, the bottom surface of outer lead portions of the lead frame and bottom surfaces of gate/source electrodes are exposed for connection to a conductor land (mount surface) of the mounting substrate. Then the perimeter of these gate/source electrodes is covered by the resin.

U.S. Pat. No. 6,133,634 discloses a flip chip package having a power MOSFET device including a drain terminal, a source terminal and a gate terminal The drain terminal connects to a conductive carrier and an outer array of solder balls. The source terminal and gate terminal connect to an inner array of solder balls. The conductive carrier and the outer array of solder balls provide electrical connection between the printed circuit board and the drain terminal.

U.S. Pat. No. 6,469,384 discloses a method of packaging semiconductor devices, such as MOSFET device, which does not require a molded body. The MOSFET device is coupled to a substrate such that the source and gate regions of the die are coupled to the substrate. The MOSFET device is placed on a printed circuit board (PCB) and the surface of the die is coupled directly to the PCB with solder paste or suitable electrically conductive interconnect, and thus serves as the drain connection. The surface of the die coupled to the substrate comprises the gate region and the source region of the die. Thus, the solder ball in the gate region of the substrate serves to couple the gate region of the die to the PCB while the remaining solder balls couple the source region of the die through the substrate to the PCB.

U.S. Pat. No. 6,646,329 discloses a semiconductor device that includes a lead frame including a source pad, at least two source lead rails at a periphery of the source pad, a gate pad adjacent to the source pad, and a gate lead rail at a periphery of the gate pad. A die is coupled to the source pad and the gate pads such that a surface of the die opposite the pads is substantially flush or co-planar with the ends of the lead rails. A stiffener is coupled to the lead frame and electrically isolated therefrom.

All of the aforementioned prior art devices require modification of external packaging to allow connection to the back of the vertical semiconductor die. In general the packaging connects to the back side of the die, and wraps around the sides to become co-planar with the front of the die. However, this configuration inherently results in a footprint larger than that of the die itself, and thus is not a true CSP. In addition, the extra material required for the packaging adds to the cost of the device.

U.S. Pat. No. 6,653,740 discloses a semiconductor die package comprising a "flip-chip" that is mountable on a circuit board or other electronic interface using one surface of the chip. In particular, the package has contacts, for example, gate, source and drain electrode contacts (for a MOSFET) on the same side of the package, and can be mounted by forming solder ball contacts on the surface of the chip which interface with the external gate, source and drain pads respectively on the circuit board. External circuit components may be electrically connected to the chip using solder balls on the source electrode of the chip, the solder balls being positioned so that they will interface with appropriate source electrical connections on the circuit board. The package is configured so that the drain electrode is on the same surface at a region separate from the source electrode. A highly doped diffusion region or "sinker" extends from and beneath the top drain electrode, through the layer of relatively low carrier concentration to the substrate. The diffusion region has the same carrier concentration and type as the substrate. Thus, an electrical path is established from the source electrode, through the active elements, and into the substrate, through the diffusion region and to the top drain electrode. The drain electrode is on the same surface as the source and gate electrodes and can thus be mounted to the circuit board using solder balls that correspond to locations of appropriate external drain connections.

The preceding prior art package designs for vertical power MOSFET devices can provide electrical contacts for source, gate and drain of power devices to chip front side for individual MOSFETs. However, some techniques require extra substrates or package material to bring the backside connection to the front surface or the use of different size of solder balls. In addition, some techniques require extra processing steps to form "sinker diffusion" or contact trenches through the drift drain. In addition, using a vertical DMOS structure with drain sinkers requires large spacing between the sinker diffusions and the active regions for high voltage structures (i.e., depletion layers from body regions in the N-drift region). Furthermore, in these "sinker diffusion" techniques, the contacts are not distributed throughout the die resulting in higher overall resistance (from spreading resistance) that lowers the efficiency.

It would be desirable to produce a package design and process for its manufacture which permits wafer level processing with lower costs and a reduced footprint for individual part, and allows distributed contact throughout the die.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Embodiments of the present invention provide a true-CSP discrete MOSFET device using bottom-source devices with all drain, source and gate connections for the package located on a front face of the die.

According to embodiments of the present invention, a semiconductor package may comprise a semiconductor substrate, a plurality semiconductor devices formed on the semiconductor substrate, a source region disposed on a bottom of the substrate that is common to all the devices in the plurality. Each semiconductor device in the plurality may comprise a drain region disposed on a top of the semiconductor device, a gate configured to control a flow of electrical current between the source region and the drain region when a voltage is applied to the gate, a source contact located proximate the gate; and an electrical connection formed through the substrate between the source contact and the source region disposed on the bottom of the substrate. At least one drain pad electrically is coupled to the drain region. At least one source pad is electrically connected the source region. At least one gate pad is electrically coupled to the gate of each semiconductor device in the plurality. The drain, source and gate pads are formed on one surface of the semiconductor package. The plurality of semiconductor devices are distributed across the substrate so that the electrical connections formed between the source contact of each semiconductor device and the source region are distributed across the substrate.

Figure 1A:
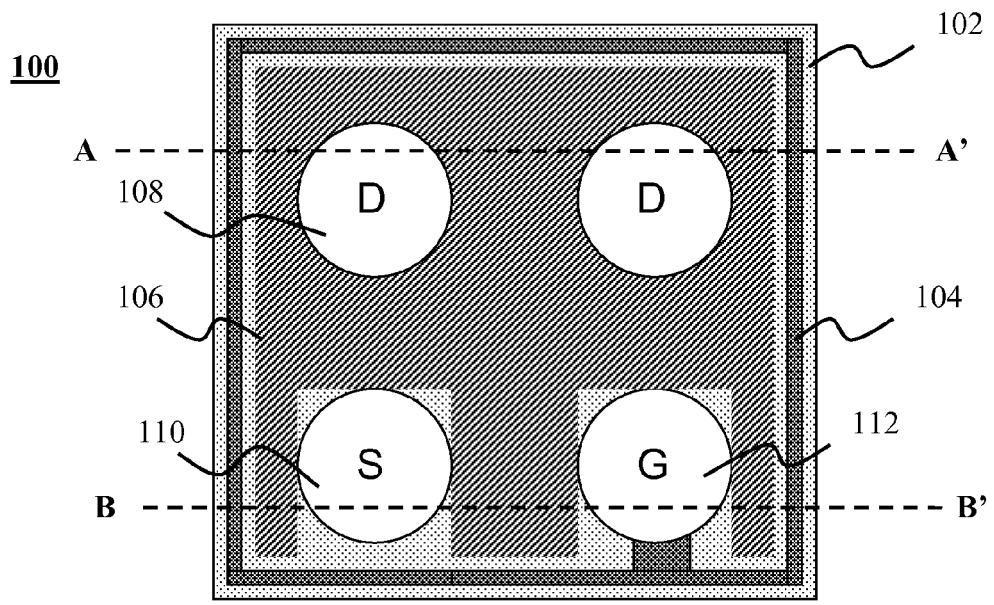
FIG. 1A is a top view of a semiconductor package including two drain, one source and one gate pads on a front surface of the device according to an embodiment of the present invention.

FIG. 1A is a top view of a semiconductor package 100 according to an embodiment of the present invention. As shown in FIG. 1, the semiconductor package 100 includes two drain pads 108, one source pad 110 and one gate pad 112 located on a front surface of a bottom source semiconductor device 102, e.g., a bottom source LDMOS device. The drain, source and gate pads 108, 110, 112 may be used to accept solder balls, bumps or pillars for CSP mounting. The drain connections 108 are located on a drain metal 106 that overlies and is in electrical contact with the active area of the LDMOS device. Optionally, an additional metal pad may be used to connect the drain pad 108 to the drain metal 106. The source pad 110 and the gate pad 112 are located on inactive areas or terminal regions of the device 102. Because this is a bottom source semiconductor die, the source pad 110 may be electrically connected to source contacts (not shown) that are distributed amongst multiple cells that make up the die. The gate pad 112 may be electrically connected to gate regions of each cell (not shown in FIG. 1A) of the LDMOS device through an electrically conductive gate ring 104 located at the periphery of the semiconductor package 100. By way of example, and not by way of limitation, the gate ring 104 may be made of polysilicon or a metal or some combination of both.

A structure of the semiconductor package 100 having more drain connections than source connection increases the active area for true-CSP MOSFETs because the drain connections are formed over the active area rather than outside the active area.

Figure 1B:
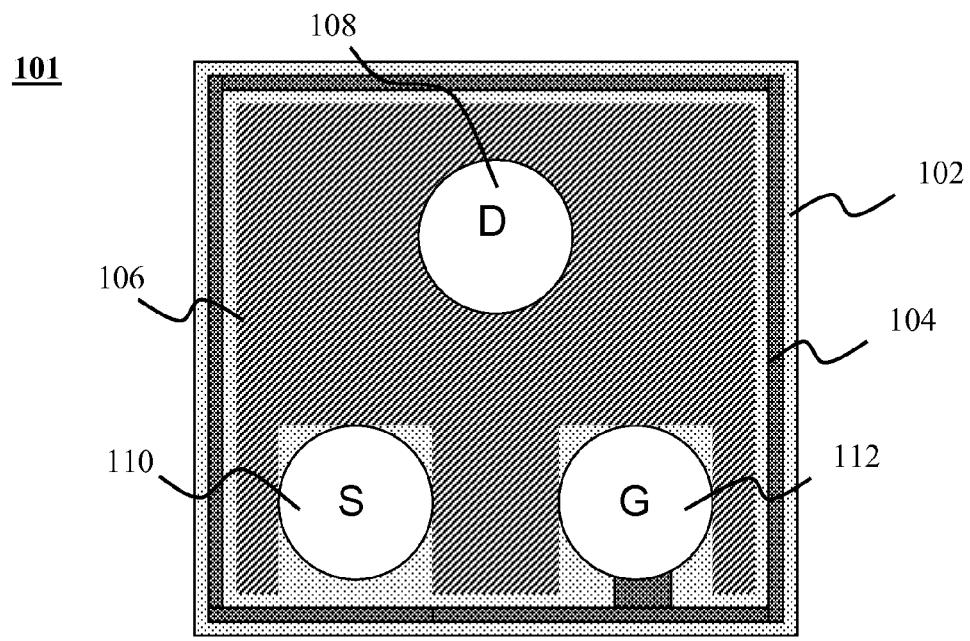
FIG. 1B is a top view of a semiconductor package including one drain pad, one source pad and one gate pad on a front surface of the device according to an alternative embodiment of the present invention.

FIG. 1B is a top view of a semiconductor package 101 according to an alternative embodiment of the present invention. As shown in FIG. 1B, the semiconductor package 101 includes only one drain pad 108, one source pad 110 and one gate pad 112 located on a front surface of the package 101. The drain pad 108 is located on a drain metal 106 over the active area of a bottom source semiconductor device 102, e.g., a bottom source LDMOS device. The source pad 110 and the gate pad 112 are located on the inactive areas of the device 102. The gate pad 112 is connected to the gate regions of the individual cells thorough the gate ring 104. The source pad, gate pad and drain pad provide for electrical connection of the semiconductor package to other circuit components, e.g., through conductive adhesive or solder balls. The minimum number of pad openings and solder ball is three in order to ensure that the die remains "level" during the assembly process. A die with fewer than three solder balls may not be level after assembly.

Figure 1C:
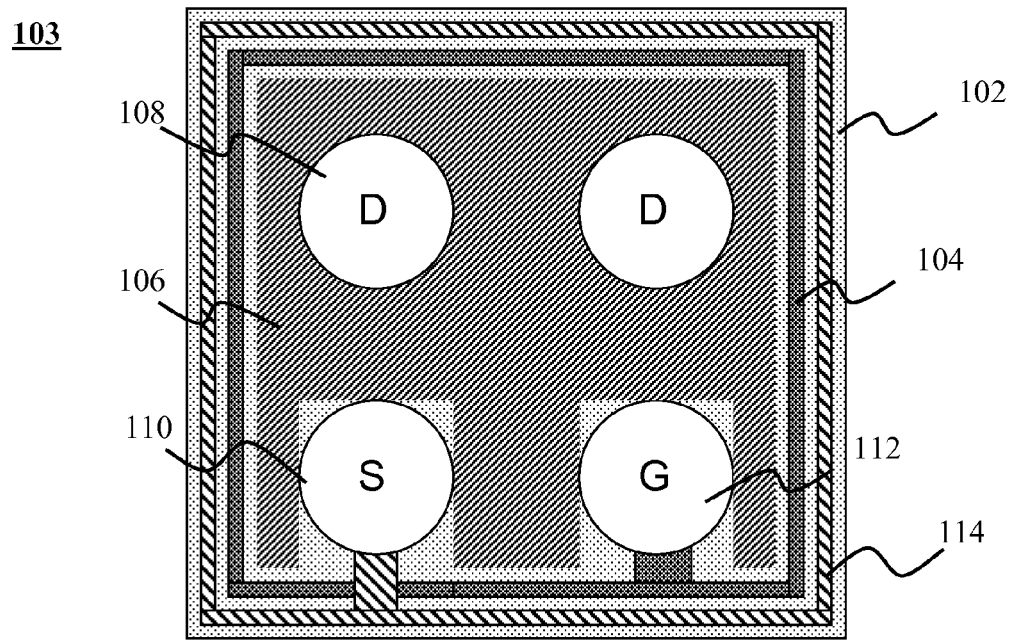
FIG. 1C is a top view of a semiconductor package including two drain pads, one source pad and one gate pad on a front surface of the device and a metalized substrate ring contact at periphery of the device according to an embodiment of the present invention.

FIG. 1C is a top view of a semiconductor package 103 according to an alternative embodiment of the present invention. Similar to the semiconductor package 100 described in FIG. 1A, the semiconductor package 103 includes two drain pads 108, one source pad 110 and one gate pad 112 located on a front surface of the semiconductor package 103. The drain pads 108 are located on active areas and the source and gate pads 110, 112 are located on inactive areas or terminal regions of a bottom source semiconductor device 102, e.g., a bottom source LDMOS device. The gate pad 112 is electrically connected to gate regions (not shown) of the cells that make up the LDMOS through a gate ring 104 located at the periphery of the semiconductor package 103. The semiconductor package 103 also includes a substrate contact ring 114 located at the periphery of the device 102. The substrate ring 114 is directly connected to the source connection 110. The substrate contact ring 114 may be made of metal.

Figure 1D:
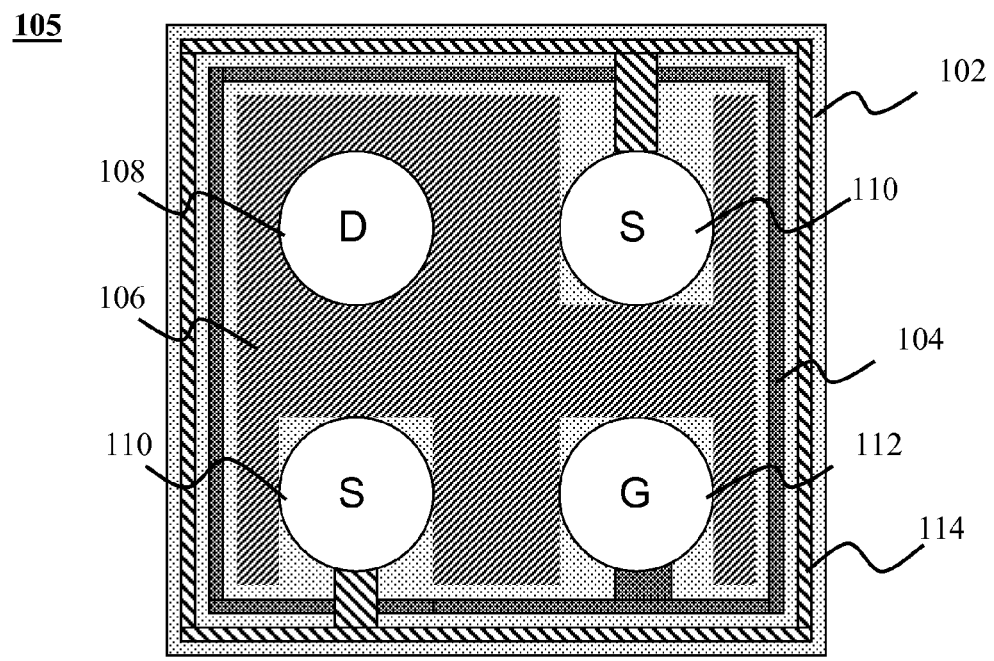
FIG. 1D is a top view of a semiconductor package including one drain pad, two source pads and one gate pad on a front surface of the device and a metalized substrate ring contact at periphery of the device according to an embodiment of the present invention.

FIG. 1D is a top view of a semiconductor package 105 according to an alternative embodiment of the present invention. As shown in FIG. 1D, the package 105 includes one drain pad 108, two source pads 110 and one gate pad 112 on a front surface of a bottom source semiconductor device 102 such as a bottom source LDMOS device. The drain pad 108 is located drain contact pad 106 which is on the active area of the package 105. The source pads 110 and the gate pad 112 are located on the inactive area 102 of the package. The gate pad 112 is electrically connected to a gate region (not shown) of the device 102 through a gate ring 104 located at the periphery of the semiconductor package 105. The semiconductor package 105 also includes a substrate contact ring 114 located at the periphery of the package 105. The substrate contact ring 114 is directly connected to the source connections 110.

The structure of the semiconductor package 105 with two source pads 110 reduces the source inductance resulting in reduced source degeneration. Reduced source degeneration is desirable for high-frequency applications (e.g., radio frequency (RF) applications).

Figure 2:
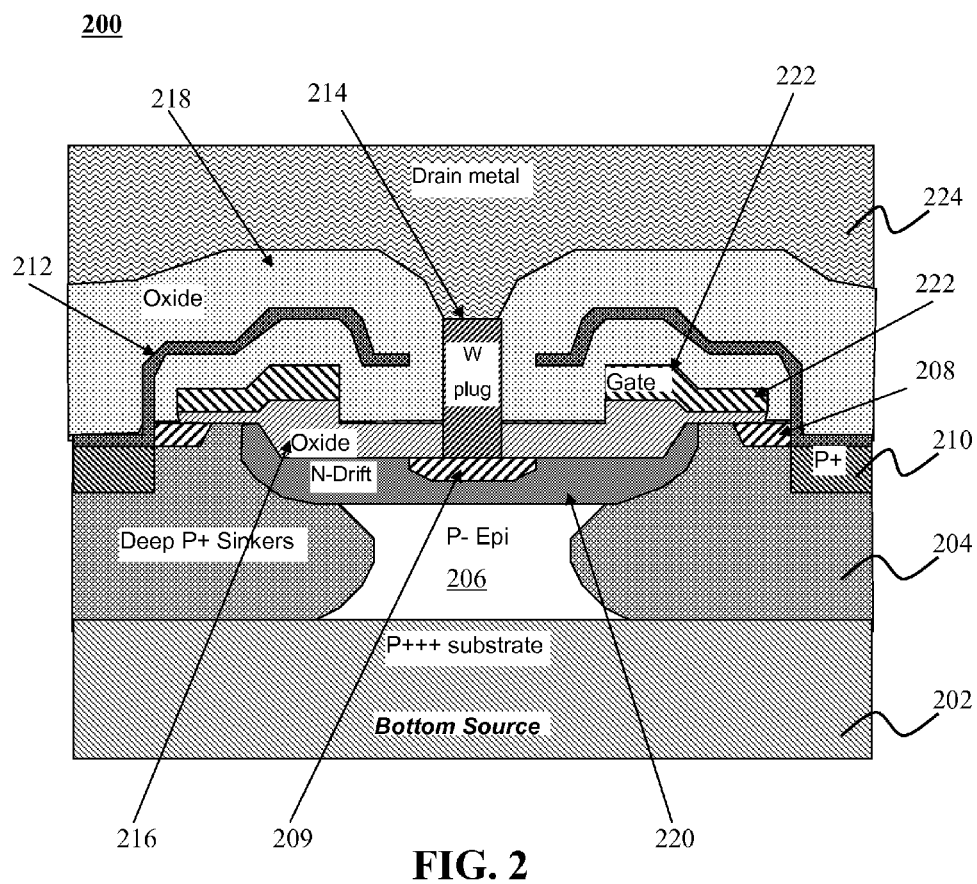
FIG. 2 is a cross-sectional view of a cell of a trenched bottom-source LDMOS device.

FIG. 2 is a cross-sectional view of a cell 200 of a trenched bottom-source LDMOS (BSLDMOS) device that may be used in conjunction with semiconductor device packages of the type described above and shown in FIGS. 1A-1D. A BSLDMOS device is made from a number of such cells. In the example shown in FIG. 2, the BSLDMOS cells 200 are supported on a heavily P-type doped (P+++) substrate 202 functioning as a bottom source electrode. A less heavily P-type doped (P−) epitaxial layer 206 is formed on top of the substrate 202. A deep sinker-channel region 204 doped with P+ dopant ions below an active cell area in the device is formed in the epitaxial layer at a depth and extended laterally to a bottom of a drain drift region 220 to compensate some of the N− dopant in the accumulation of the transistor for tailoring a dopant profile of N-drift region 220 to minimize the gate-drain capacitance while maintaining a low drain to source resistance $R_{dson}$. The sinker regions 204 function as a sinker-channel to connect the P+++ source portion of the substrate 202 to a P+ body contact region 210, and also acts as the body region where the MOSFET channel is formed under the gate 222. A gate 222 surrounded by oxide 218 is disposed above the gate oxide layer 216 formed between the top surface of the top source region 208 and the drain drift region 220. The gate 222 thus controls the current flow between the top source region 208 and the N-drift region 220 through the channel formed in the sinker-channel region 204 to function as a lateral MOS device. The drain region 220 is disposed below the oxide 216. An electrically conductive plug 214, e.g., made of tungsten, may be used to electrically connect a top drain metal 224 to the drain drift region 220 via a N+ doped contact region 209 with reduce contact resistance. A buried gate shield 212 may be disposed above the gate 222, surrounded by oxide 218 and in contact with the P body contact region 210 and source region 208. The buried shield 212 may be used to short top source region 208 to the P body contact region 210 and thus to sinker-channel region 204 and so acts as a buried body-source short structure. The top source region 208 is electrically connected to the bottom source P+++ substrate 202 through the buried gate shield 212 and sinker region 204. By way of example, and not by way of limitation, the buried shield 212 may be made of Titanium Nitride (TiN).

A description of a similarly structured trenched bottom-source LDMOS may be found in commonly-assigned US Patent Application Publication No. 20080023785, the entirety of which is incorporated herein by reference.

The advantages of the semiconductor package configurations shown in FIGS. 1A-1D may be understood by referring to FIG. 3, FIG. 4A, FIG. 4B, FIG. 5A and FIG. 5B.

Figure 3:
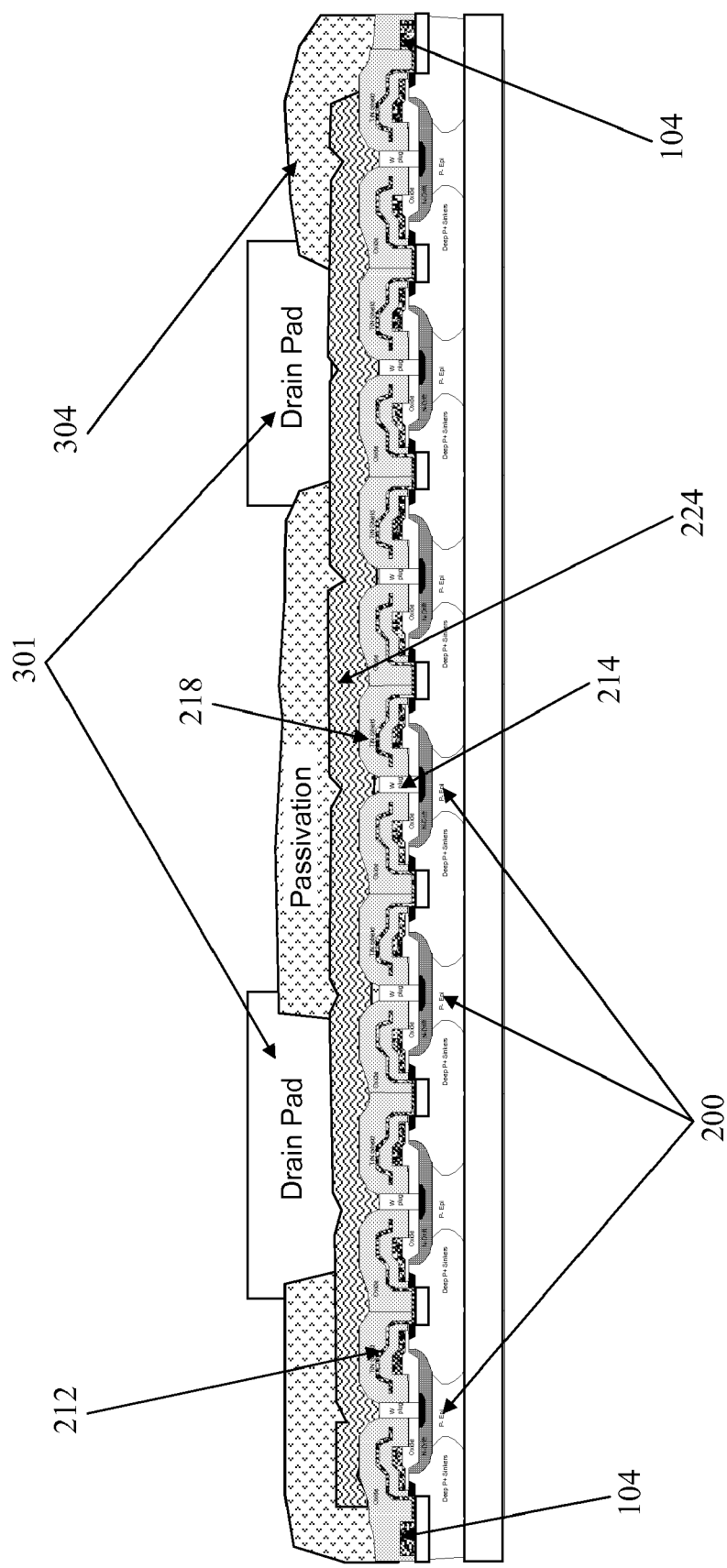
FIG. 3 is a cross-sectional view of the semiconductor package of FIG. 1A along line A-A' comprising a plurality of bottom-source LDMOS cells of the type shown in FIG. 2 according to an embodiment of the present invention.

FIG. 3 is a cross-sectional view of the semiconductor package 100 described in FIG. 1A along a line A-A'. As shown in FIG. 3, the semiconductor package 100 includes multiple trenched bottom-source LDMOS cells 200 of the type depicted in FIG. 2. The presence of these cells makes this region of the device package an active area. A gate ring 104 is located at the periphery of the semiconductor package 100. A common drain metal 224 is disposed above the trenched bottom-source LDMOS devices 200 and is in electrical contact with all of the conductive plugs 214 of the bottom-source LDMOS devices 200. A drain pad 301 may be formed on top of the common drain metal 224 and are electrically isolated from each other by a passivation layer 304, which may be made of polyimide. Alternatively, the drain pad 301 may comprise of the portion of the drain metal 224 exposed through the passivation 304. The drain pad 108 may be place on top of the drain pad 301. The buried shield 212 is used to short source region 208 to the P body contact region 210.

Figure 4A:
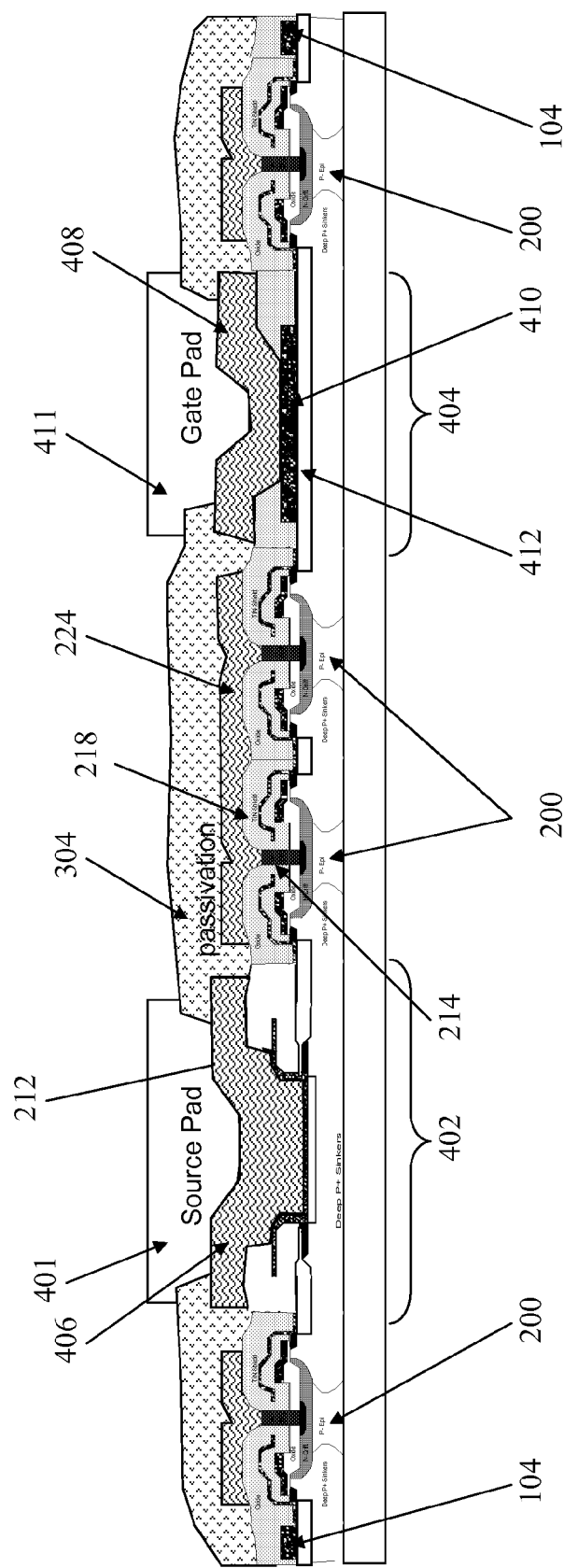
FIG. 4A is a cross-sectional view of the semiconductor package of FIG. 1A along line B-B' comprising a plurality of bottom-source LDMOS cells of the type shown in FIG. 2 according to an alternative embodiment of the present invention.

FIG. 4A is a cross-sectional view of the semiconductor package 100 described in FIG. 1A along a line B-B'. As shown in FIG. 4A, the source pads 401 and the gate pad 411 are formed on the inactive areas 402 and 404 respectively. In the inactive area 402, the buried shield 212 is extended to provide space for a source metal 406. A source metal 406 is disposed above the buried shield 212 and is in electrical contact with the source regions 208 of the devices 200 via the P+ sinkers 204. The source pad 401 may be formed on top of the source metal 406, or alternatively the source pad 401 may comprise a portion of the source metal 406 that is exposed through an opening in the passivation 304. A solder ball or electrically conductive adhesive (not shown) may be placed on the source pad 401 to provide electrical contact to an external circuit component. In the inactive area 404, a gate electrode 410 may be formed over the deep P+ sinker 204 on a region that does not have cells 200. The gate electrode 410 may be electrically connected to the individual gates 222 of the cells 200 through the gate ring 104. The gate electrode 410 may be electrically isolated from the deep P+ sinker 204 by an oxide layer 412. The gate electrode 410 may be made of polysilicon or metal. The gate electrode 410 may also be surrounded by portions of the oxide 218 that covers the buried shields 212. A gate metal 408 may be formed on top of the gate electrode 410. The gate pad 411 may then be formed on top of the gate metal 408, or alternatively the gate pad 411 may comprise a portion of the gate metal 408 that is exposed through an opening in the passivation 304. solder ball or electrically conductive adhesive (not shown) may be placed on the gate pad 411 The source pad 401 and the gate pad 411 are electrically isolated by the passivation layer 304.

Figure 4B:
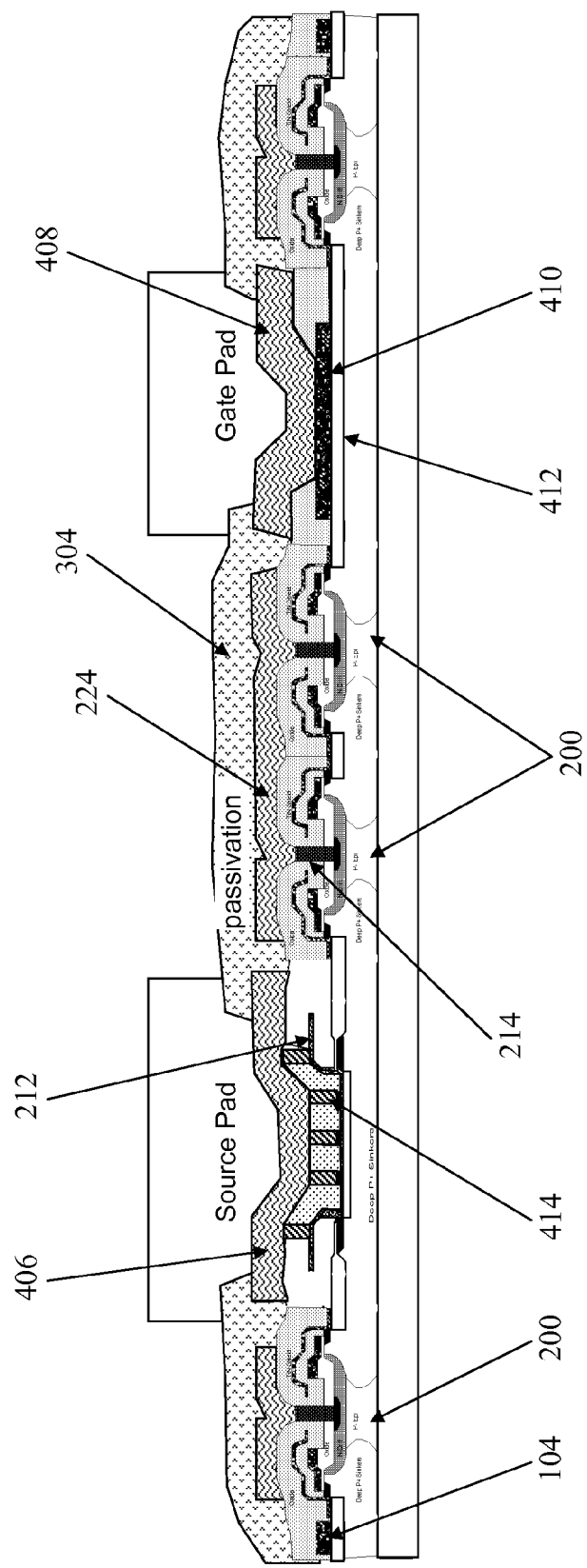
FIG. 4B is a cross-sectional view of the semiconductor package of FIG. 1 along line B-B' comprising a plurality of bottom-source LDMOS devices of the type shown in FIG. 2 and conductive plugs in a source pad area according to an embodiment of the present invention.

FIG. 4B is alternatively cross-sectional view of the semiconductor package 100 described in FIG. 1 along a line B-B'. In this embodiment, the source metal 406 is disposed above the buried shield 212 and is electrically contacted to the buried shield 212 via plugs 414 made of electrically conductive material, e.g., a metal, such as tungsten.

Figures 5A, 5B:
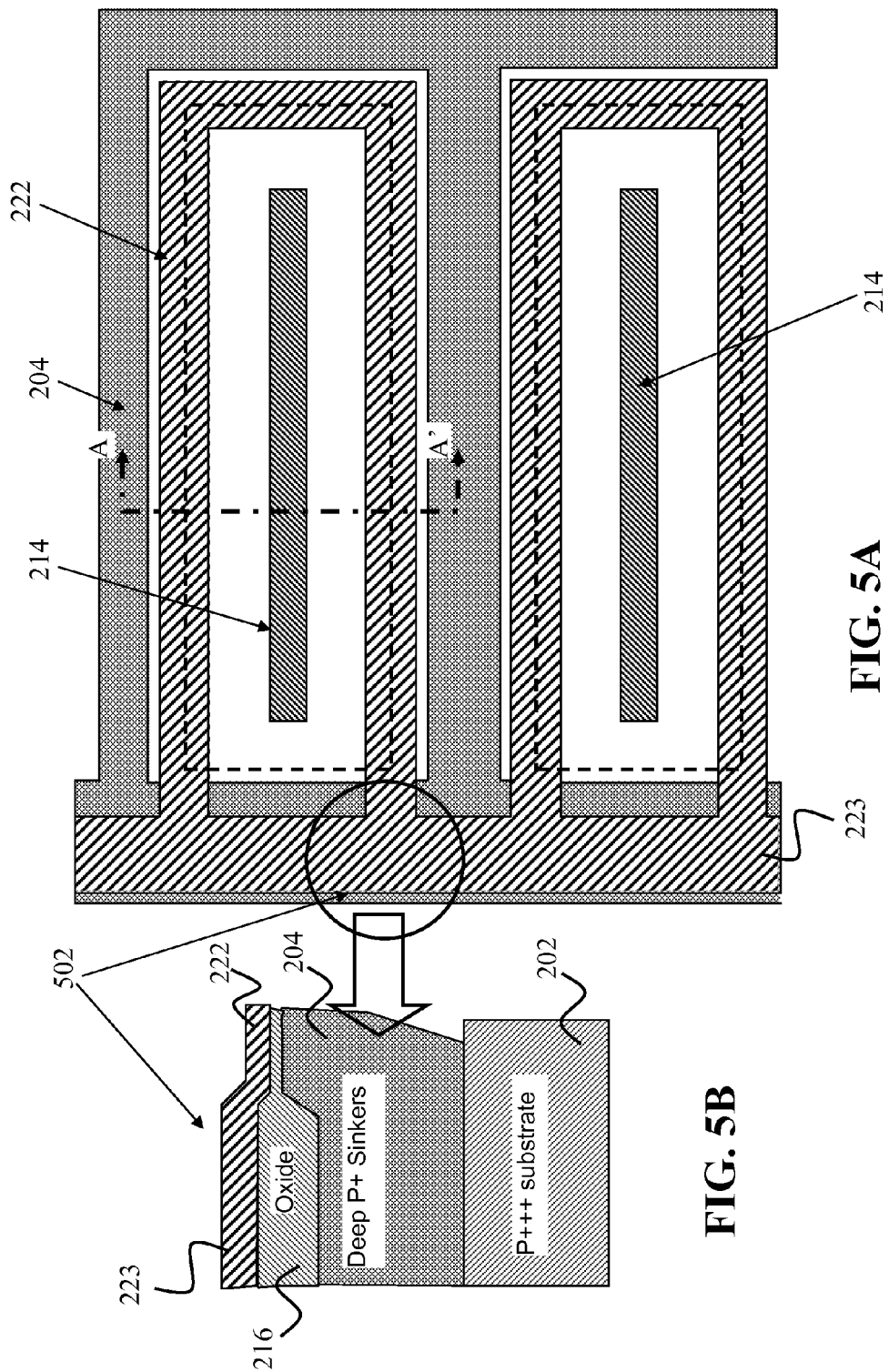
FIG. 5A is a top view of a layout of the semiconductor package of FIG. 4A-4B illustrating one sided top gate connection.
FIG. 5B is a cross-sectional view of a gate interconnect region of FIG. 5A
Figure 5C:
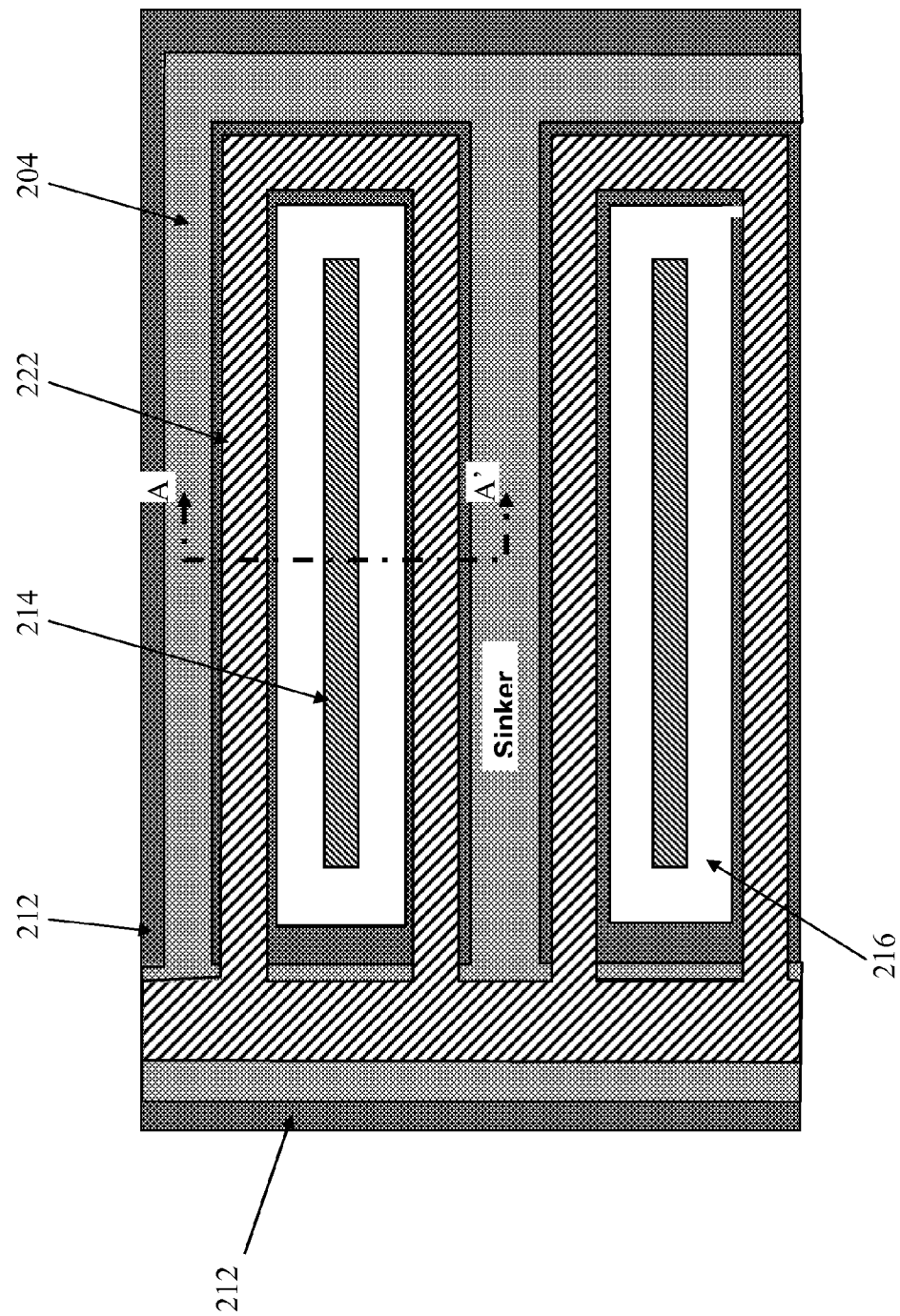
FIG. 5C is a top view of a layout of the semiconductor package of FIGS. 4A-4B illustrating one sided top gate connection with a buried gate shield used to route the source connection over the die.

FIG. 5A is a top view of a layout of the semiconductor package of FIGS. 4A-4B illustrating a one sided top gate connection. In FIG. 5A, the gate shield 212 and the drain metal 224 have been omitted for the sake of clarity. The conductive plugs 214 are surrounded by gates 222 and are electrically isolated from the gates 222 with oxide 218 (not shown). The gates are connected to gate runners 223, which provide electrical connection between the gates 222 and the gate electrode 410. P+ sinkers 204 are found next to the gates 222. FIG. 5B is a cross-sections view of a gate interconnect region 502 of FIG. 5A, which includes a deep P+ sinker 204 disposed on top of the P+++ substrate 202 and the gate 222 disposed on top of the deep P+ sinker 204 and electrically isolated from the deep P+ sinker 204 with the oxide 216. The oxide 216 is thicker in areas where the gate is not active (e.g. gate runner 223) in order to reduce parasitic capacitance between the gate and the ground (source). The electrical connection between the distributed bottom source contacts may be provided by the P+ sinkers 204 in each cell and the source pads 110 located over the inactive area 402 may be provided through the substrate 202. Alternatively, as shown in FIG. 5C, the buried gate shield metal 212 may be used as an interconnect to help distributing the source current. The buried gate shield 212 is a conductor that may be used to route the source connection over the semiconductor device. As shown in FIG. 5C, the buried gate shield 212 shown the overlapping gate electrode. Though not illustrated this way for clarity, the buried gate shield 212 actually overlies the gates 222 and the P+ deep sinkers 204. The drain metal 224 (not shown) covers the entire active area of the devices in FIG. 5A and FIG. 5C though it is mostly insulated by oxide 218 (not shown) and makes contact through the conductive plugs 214. Similarly, the P+++ substrate 202 (not shown) underlies the entire area. The buried gate shield 212 runs under the drain metal 224. By way of example, the cross sections A-A' of FIG. 5A and FIG. 5C may be represented by FIG. 2.

Figure 6:
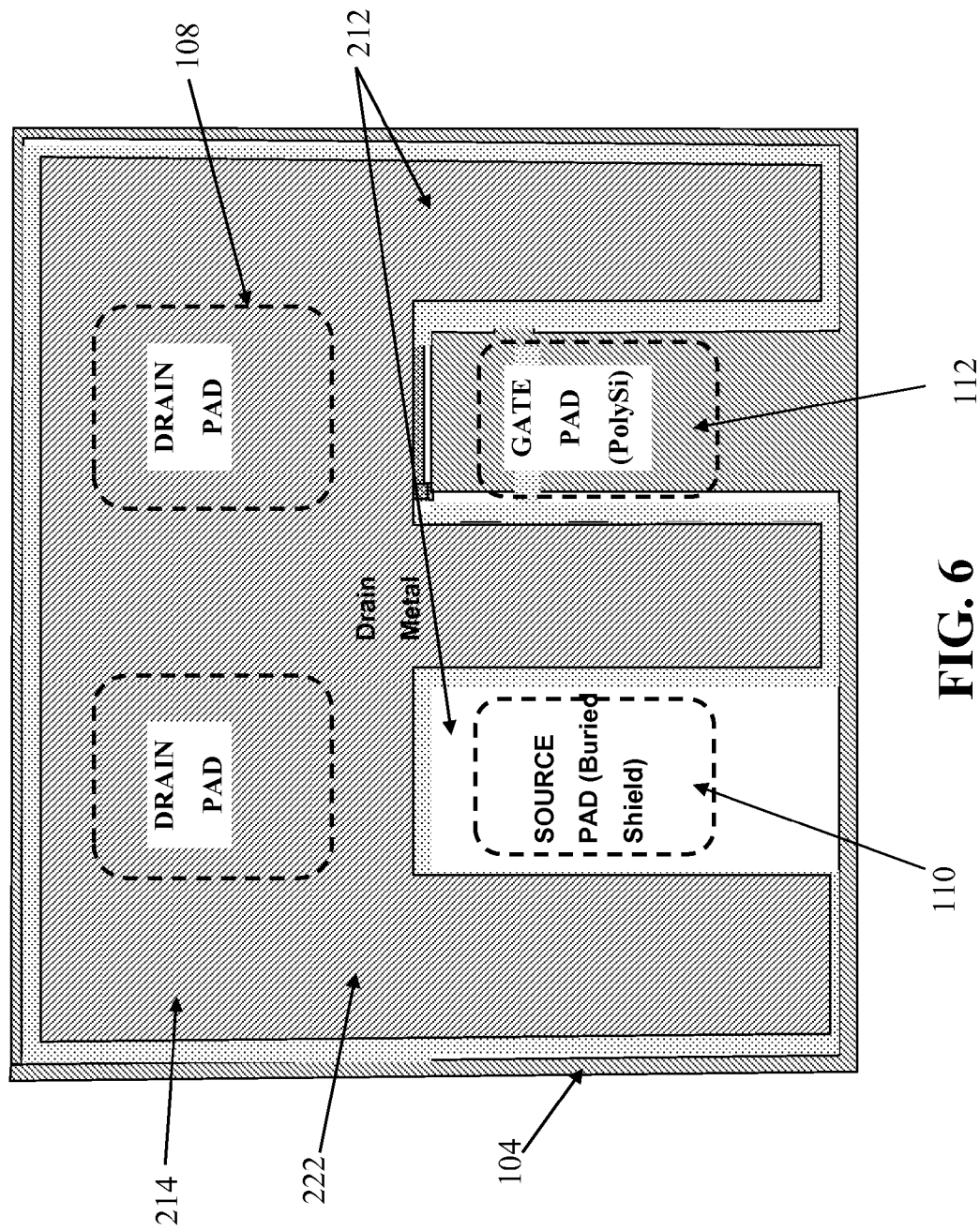
FIG. 6 is a top view of the semiconductor package of FIG. 1 illustrating a gate shield connection to the source pad.

FIG. 6 is a top view of the semiconductor package 100 of FIG. 1A illustrating a gate shield connection to the source pad. In FIG. 6, the metal over the source pad 110 and gate pad 112 are transparent for the sake of clarity. As shown in FIG. 6, the drain metal 224 covers the whole active area 106 of the semiconductor package 100 and the drain pads 108 is disposed on top of the drain metal 224. The gates 222 of the individual devices 200 are disposed under the drain metal 224. A gate ring 104 runs around the active area. Electrical contact between the gates 222 and the gate pad 112 is provided by gate runners 223 and the gate ring 104, which is disposed around the periphery of the device and is in electrical contact with the gate pad 112. The buried shield 212 may be directly electrically connected to the source pads to help distribute the source current. Preferably the buried shields 212 are interconnected and have direct contact with the source pad (as shown in FIG. 6) for low resistance distribution. However, this is not a requirement, as the buried shields 212 can also be connected together through the source/body contacts and sinker regions 204.

Figure 7:
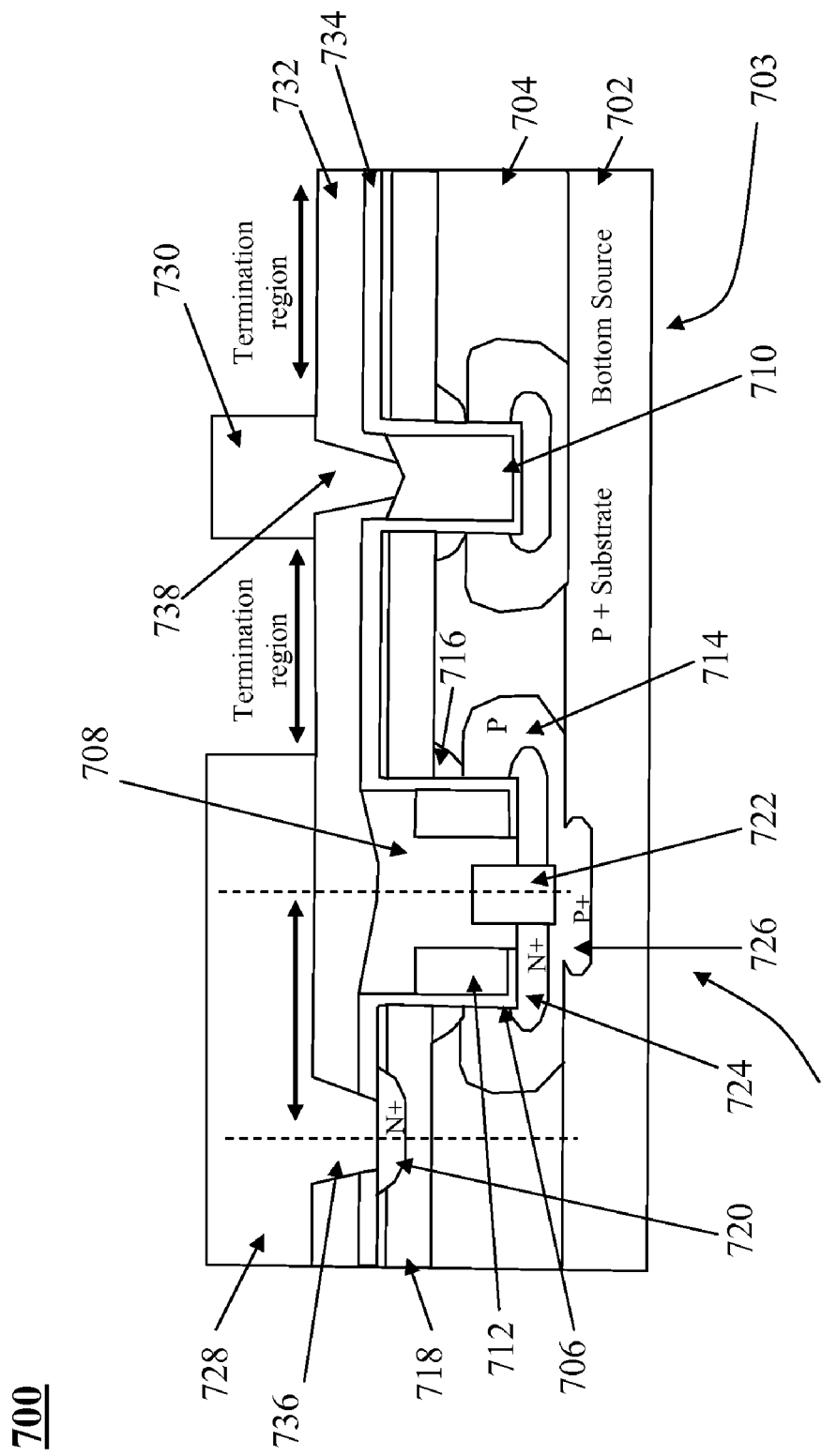
FIG. 7 is a cross-sectional view of an inverted trench Vertical channel MOSFET.

FIG. 7 is a cross-sectional view of a portion of an N-channel inverted ground-source trenched FET device 700 having a bottom source and a top drain. The inverted ground-source trenched N-channel FET device 700 is supported on a P+ substrate 702 functioning as a bottom source electrode. Alternatively a P-channel device may be formed over a N+ doped Silicon substrate or other substrate such as Silicon Carbide, Gallium Nitride (GaN), or other kinds of semiconductor substrates, etc. A P-epitaxial layer 704 is formed on the substrate 702. The substrate is configured with an active cell area 701 and a termination area 703 typically disposed on the periphery of the substrate. The FET device 700 has a plurality of trenches opened from the top surface of the substrate to reach to a lower portion of the epitaxial layer 704. The trenches in the active cell area 701 are made wider to form a gate within each cell with a gate polysilicon layer 712 formed along the sidewalls of the trench with the sidewalls of the trenches padded with a trench wall oxide layer 706 and the central portion filled with an insulation material, e.g., a BPSG layer 708. A trench of a narrower width is formed in both the termination area or within the active area to form the gate runner 710 that may provide electrical connection between the trenched sidewall gate 712 in the active area to the termination area and a gate contract formed over an inactive area. A P-body region 714 is formed in the epitaxial layer surrounding the insulated trenched sidewall gate 712. An N-doped link region 716 is formed on top of the P-body region 714 to contact a N-doped drift region 718 that encompasses a N+ drain contact region 720 near the top surface of the substrate linking the drift region 716 and a doped channel region.

Each cell in the trenched vertical FET device further includes a body-source short structure formed at the bottom of the trenches in the active cell area. The body-source short structure is formed with a buried conductive plug 722, e.g., made of a silicide of Ti, Co, or W, surrounded by a highly doped N+ region 724 and a highly doped P++ region 726 below the buried conductive plug 722 to form a highly conductive low resistivity body-source short structure. A drain metal 728 covers the active cell area and a gate metal 730 is formed in the termination area. The drain metal and the gate metal are respectively in electrical contact with the drain 720 and a gate runner 710 through a drain contact 736 and gate contact 738 surrounded by the dielectric layer 732, e.g., a BPSG layer, and an insulation layer, e.g., an oxide layer 734, covering the top surface of the FET device. The drain and gate contacts 736, 738 are preferably conductive plugs, e.g., tungsten plugs. The integrated buried body-source short structures formed by the buried conductive plugs 722 in each cell as shown may be configured to evenly distribute the source current among the cells that make up the device. The device structure provides a vertical channel that includes a bottom source with the source connected to the bottom of the substrate. The device 700 is implemented without using a P+ sinker immediately below the source region. Instead, the bottom source device employs an embedded source and body with the body-source short structure 722. Therefore, this device structure saves the lateral space and avoids the lateral diffusion for the P+ sinker.

Additional description of an inverted ground-source trenched lateral diffusion MOSFET (LDMOSFET) similar to that shown in FIG. 7 may be found in the US Publication No. 20080035987, the entire of which is incorporated herein by reference.

Figure 8:
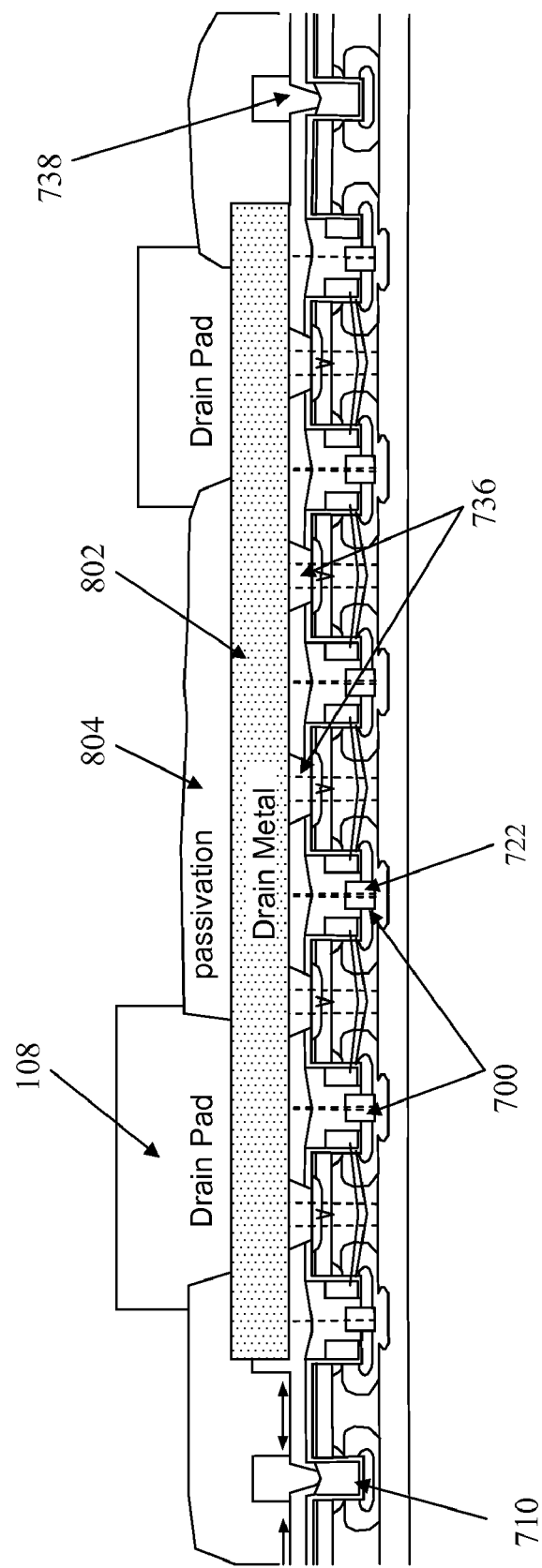
FIG. 8 is a cross-sectional view of the semiconductor package of FIG. 1A along line A-A' comprising inverted trench Vertical channel MOSFET devices of FIG. 7 according to an embodiment of the present invention.

FIG. 8 is a cross-sectional view of a semiconductor package like that shown FIG. 1A taken along line A-A' comprising inverted trench Vertical channel MOSFET devices of the type shown in FIG. 7. As shown in FIG. 8, the semiconductor package 100 includes multiple inverted trenched vertical channel MOSFET devices 700 with the active cells 701 are in the active area 106 and the gate runner 710 is disposed at the periphery of the package 100. A common drain metal 802 is disposed above inverted trench Vertical channel MOSFET active cells 701 and is electrically contacted with the cells 701 via a conductive plug 736, which may be made of a metal, such as Tungsten. Drain connections 108 are formed on top of the common drain metal 802 and are electrically isolated from each other by a passivation layer 804. The integrated buried body-source short structures 722 in each of the cells 701 provide distributed source contacts throughout the package 100.

Figure 9:
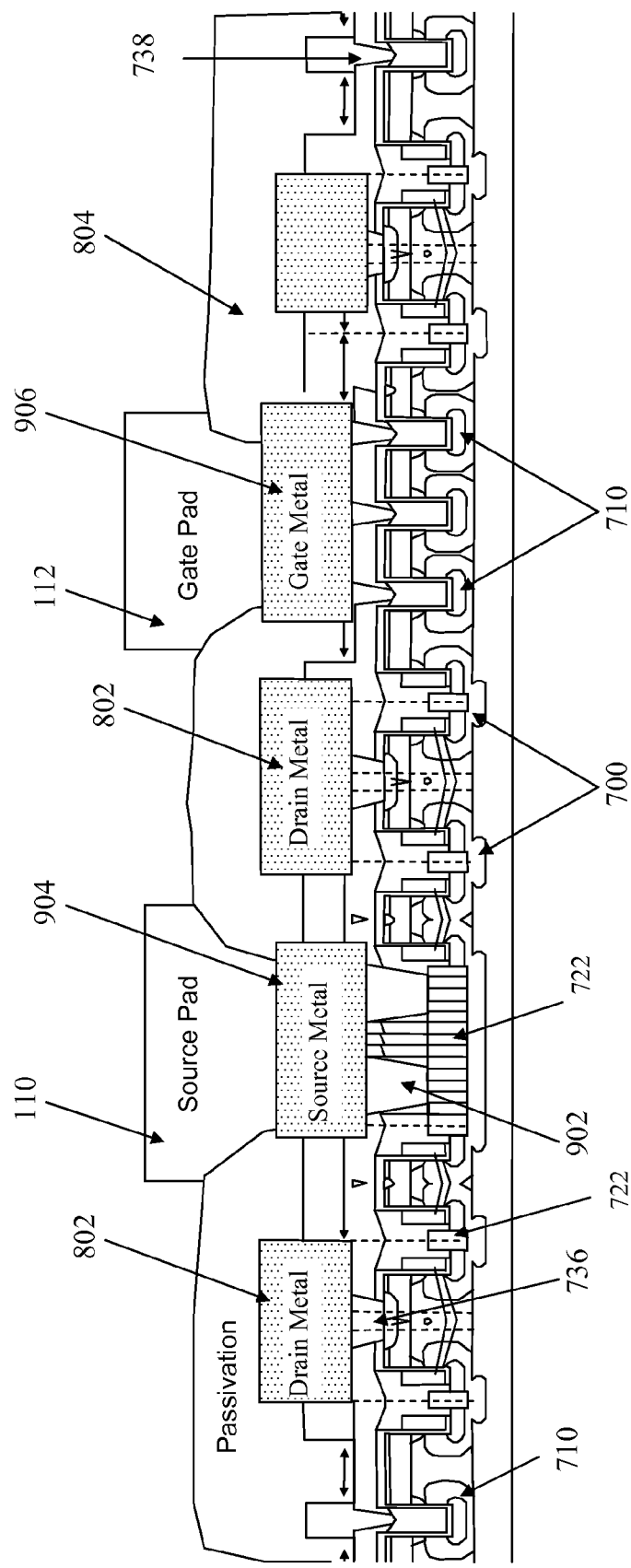
FIG. 9 is a cross-sectional view of the semiconductor package of FIG. 1A along line B-B' comprising the inverted trench Vertical channel MOSFET devices of FIG. 7 according to an embodiment of the present invention.

FIG. 9 is a cross-sectional view of the semiconductor package of FIG. 1 along line B-B' comprising the inverted trench Vertical channel MOSFET devices of FIG. 7 according to an embodiment of the present invention. As shown in FIG. 9, the source connection 110 is formed by a wide trench with source metal 904 and conductive (e.g., tungsten) plugs 902 inside the trench to contact the buried conductive plug 722. The gate pad 112 is formed on top of a gate metal 906 electrically connected to an array of gate runners 710 via conductive plugs 738. Under the correct layout, the buried conductive plug 722 may distribute the source throughout the semiconductor device, without needing to go through the substrate, to achieve lower resistance.

The structures of the semiconductor packages described above in FIGS. 2-9 provide distributed substrate connection within the entire active area of the device, which reduces the resistance and inductance of the resulting device packages. Embodiments of the present invention are applicable to both N-channel, and P-channel MOSFETs. Having the source on the back of the device also provides improved shielding and reduced electromagnetic interference (EMI). For N-channel MOSFETs, having the source on the back can also reduce the risk of electric shock, since the source potential is at ground. These structures may be manufactured using standard processing techniques without deep trench etching or any specialized processing steps often required for a typical bottom source MOSFET device. In addition, there is no extra processing step required to form substrate contacts. All surface outside of the active regions act as substrate contact regions to further minimize the substrate resistance.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor chip scale package (CSP) comprising:
    a semiconductor substrate having a source electrode disposed on a first side of the substrate;
    a plurality of device cells formed in an active area of the substrate, wherein each device cell in the plurality includes a source region, a drain region and a gate configured to control a flow of electrical current between the source region and the drain region when a voltage is applied to the gate, wherein the source region of each device is electrically coupled to the source electrode;
    a gate pad and a drain pad formed on a second side of the substrate, wherein the drain region of each cell is electrically coupled to the drain pad, wherein the gate of each cell is electrically coupled to the gate pad;
a source pad formed on the second side of the substrate; and
one or more conductive contacts configured to provide an electrical connection between the source electrode and the source pad.

2. The semiconductor chip scale package (CSP) of claim 1, wherein each device cell further includes a body region with a conductivity type opposite to the source region and the drain region, said body region and said source region being electrically coupled to a conductor layer.

3. The semiconductor chip scale package (CSP) of claim 1, wherein the one or more conductive contacts are formed within the substrate.

4. The semiconductor CSP of claim 1 wherein the one or more conductive contacts include a buried body-source short structure connected to the source pad, wherein the buried body-source short structure runs beneath the a drain metal substantially covering the entire active area.

5. The semiconductor chip scale package of claim 4, wherein the body-source short structure is a buried gate shield.

6. The semiconductor chip scale package of claim 4, wherein the body-source short structure is a buried conductive plug.

7. The semiconductor chip scale package of claim 4, wherein the body-source short structure distributes the source throughout the semiconductor device.

8. The semiconductor chip scale package of claim 1 further comprising a gate ring disposed at a periphery of the semiconductor package, configured for interconnection between the gate pad and a gate region of the semiconductor device.

9. The semiconductor chip scale package of claim 8 further comprising a metalized substrate ring disposed at the periphery of the semiconductor package, configured to directly connect to the source pad.

10. The semiconductor chip scale package of claim 1, wherein each cell further comprises a conductive plug configured to electrically connect the drain region to the drain metal.

11. The semiconductor chip scale package of claim 10 wherein the MOSFET is a bottom-source LDMOS device.

12. The semiconductor chip scale package of claim 11, wherein the electrical connection formed between the source contact of each cell of the bottom-source LDMOS device and the source region comprises a top source region, the substrate, and a combined sinker-channel region in an epitaxial layer, wherein the combined sinker-channel region functions as a sinker that electrically connects the substrate to the top source region and as a body region where a MOSFET channel is formed, and wherein the one or more conductive contacts include a buried body-source short structure shorts the top source region to the sinker-channel region.

13. The semiconductor chip scale package of claim 12, wherein the bottom-source LDMOS device further comprises a drift region disposed under the gate region and at a distance away from the source region and extending to and encompassing the drain region.

14. The semiconductor chip scale package of claim 13, wherein the combined sinker-channel region extending below the drift region and having a dopant conductivity opposite to and compensating the drift region for a reduced source-drain capacitance.

15. The semiconductor chip scale package of claim 14, wherein the bottom-source LDMOS device wherein the buried body-source short structure comprises a buried gate shield layer comprising a conductive layer disposed above the gate region, the source region and the body region.

16. The semiconductor chip scale package of claim 15, wherein the buried gate shield layer comprises a Titanium Nitride or Titanium Silicide metallization.

17. The semiconductor chip scale package of claim 15 wherein the source pad is located over the buried gate shield layer.

18. The semiconductor chip scale package of claim 17 wherein the buried gate shield layer distributes the source throughout the semiconductor device.

19. The semiconductor chip scale package of claim 17, further comprising one or more conductive plugs to connect the source pad to the buried shield gate layer.

20. The semiconductor chip scale package of claim 1, wherein the MOSFET comprises an inverted-trench grounded-source vertical channel MOSFET device.

21. The semiconductor chip scale package of claim 20, wherein each cell of the inverted-trench grounded-source vertical channel MOSFET device further comprises:
a vertical current conducting channel between the source region and the drain region controlled by a vertical sidewall gate region disposed on sidewalls of a trench and padded by a gate oxide layer attached to the sidewalls of the trench;
wherein the buried body-source short structure is a buried conductive plug extending downwardly from a bottom surface of the trench for electrically shorting a body region in the semiconductor substrate to a source region disposed at a bottom of the trench.

22. The semiconductor chip scale package of claim 18, wherein the buried conductive plug in each cell is configured to distribute the source among the cells in the plurality.

23. The semiconductor chip scale package of claim 18, wherein the conductive plug in each cell comprises a silicide of Titanium, Cobalt or Tungsten.

24. A method for manufacturing a semiconductor chip scale package (CSP) comprising:
disposing a source electrode on a first side of a semiconductor substrate;
forming a plurality of device cells in an active area of the substrate, wherein each device cell in the plurality includes a source region, a drain region and a gate configured to control a flow of electrical current between the source region and the drain region when a voltage is applied to the gate, wherein the source region of each device is electrically coupled to the source electrode;
forming a gate pad and a drain pad on a second side of the substrate, wherein the drain region of each cell is electrically coupled to the drain pad, wherein the gate of each cell is electrically coupled to the gate pad;
forming a source pad formed on the second side of the substrate; and
forming one or more conductive contacts configured to provide an electrical connection between the source electrode and the source pad.

* * * * *